United States Patent [19]
Watanabe et al.

[11] Patent Number: 5,717,206
[45] Date of Patent: Feb. 10, 1998

[54] ELECTRON MULTIPLIER FOR SCANNING ELECTRON MIRCROSCOPES

[75] Inventors: Hiroyuki Watanabe; Hideyuki Suzuki; Masahiko Iguchi, all of Hamamatsu, Japan

[73] Assignee: Hamamatsu Photonics K.K., Shizuoka-Ken, Japan

[21] Appl. No.: 731,277

[22] Filed: Oct. 11, 1996

[30] Foreign Application Priority Data

Oct. 11, 1995 [JP] Japan .................................. 7-263200

[51] Int. Cl.⁶ .......................... H01J 37/244; H01J 37/28
[52] U.S. Cl. .................................. 250/310; 250/397
[58] Field of Search ............................ 250/310, 397

[56] References Cited

U.S. PATENT DOCUMENTS

| | | | |
|---|---|---|---|
| 3,896,308 | 7/1975 | Venables et al. | 250/305 |
| 4,868,394 | 9/1989 | Fukuhara et al. | 250/310 |
| 4,958,079 | 9/1990 | Gray | 250/310 |

FOREIGN PATENT DOCUMENTS

| | | | |
|---|---|---|---|
| 0 561 584 | 9/1993 | European Pat. Off. | H01J 37/28 |
| 62-217550 | 9/1987 | Japan | H01J 37/20 |
| 2-275368 | 11/1990 | Japan | G01R 19/00 |
| 5-88502 | 12/1993 | Japan | H01J 37/244 |
| 6-208840 | 7/1994 | Japan | H01J 37/20 |
| 6-310076 | 11/1994 | Japan | H01J 37/28 |

OTHER PUBLICATIONS

Patent Abstracts of Japan vol. 015, No. 037 (P-1159), Jan. 29, 1991, & JP 02 275368 A (Fujitsu Ltd) Nov. 9, 1990, *Abstract*.

*Primary Examiner*—Jack I. Berman
*Attorney, Agent, or Firm*—Sughrue, Mion, Zinn, Macpeak & Seas, PLLC

[57] ABSTRACT

In the scanning electron microscope 10, the electron beam B is emitted to the specimen 2. When the electron beam B strikes the specimen 2, the specimen 2 reflects the electron beam as reflected primary electrons and generates secondary electrons. Those electrons are detected by the electron detector 14, which in turn produces a reflection image of the specimen 2. The electron multiplier 1 is used for this scanning electron microscope 10. The electron multiplier 1 includes the electron reflection plate 7 which receives the electron beam B when the electron beam B passes by or passes through the specimen 2. Upon receipt of the electron beam B, the electron reflection plate 7 reflects the electron beam B as reflected primary electrons and generates secondary electrons. The microchannel plate 3 is formed with a multiplicity of channels 31 for multiplying the reflected primary electrons and the secondary electrons.

19 Claims, 6 Drawing Sheets

ELECTRON MULTIPLIER FOR SCANNING ELECTRON MIRCROSCOPES

BACKGROUND OF THE INVENTION

1. Field of the Invention

The present invention relates to scanning electron microscopes.

2. Description of the Related Art

A scanning electron microscope is for forming an image of a specimen by means of electrons. There are known two types of electron microscopes: a reflection type scanning electron microscope and a transmission type scanning electron microscope.

In the reflection type scanning electron microscope, an electron beam is emitted from an electron beam source toward a specimen. When the electron beam (primary electrons) reaches the specimen, the specimen reflects the primary electrons as reflected primary electrons. The specimen also generates secondary electrons. Thus obtained reflected primary electrons and the secondary electrons bear thereon information on the surface of the specimen. Those electrons will be referred to collectively as specimen-reflected electrons hereinafter. The specimen-reflected electrons are then detected and processed into an image (reflection image) of the specimen. Japanese Patent Application Publication Kokai 2-275368 discloses an electron beam device related to this type of scanning electron microscope.

Also in the transmission type scanning electron microscope, an electron beam is emitted from an electron beam source toward the specimen. This type of scanning electron microscope detects the electron beam when the electron beam does not reflect off the specimen but passes through the specimen. Those electrons will be referred to as non-specimen-reflected electrons hereinafter. The non-specimen-reflected electrons bear thereon information on a transmission image of the specimen. The transmission image indicates the internal structure of the specimen. This scanning electron microscope processes the non-specimen-reflected electrons and produces the transmission image of the specimen. A scanning electron microscope disclosed in Japanese Patent Application Publication Kokai 6-310076 is of this type.

SUMMARY OF THE INVENTION

With the reflection type electron microscope, a user can observe a surface of the specimen. However, the user can not observe the internal structure of the specimen. In other words, the reflection type scanning electron microscope can not use electrons that have passed through the specimen. When desiring to observe the internal structure of the specimen, therefore, the user needs a transmission type scanning electron microscope separately from the reflection type scanning electron microscope.

Contrarily, the transmission type scanning electron microscope allows the user to observe both the internal structure and the surface structure of the specimen. This is because the transmission type scanning electron microscope is provided with two electron detectors. One electron detector is positioned below a specimen, and the other is positioned above the specimen. The lower detector is provided especially for receiving electrons which have passed through the specimen. The lower detector therefore produces a transmission image of the specimen. The upper detector is provided especially for receiving electrons which are reflected from the specimen. The upper detector therefore produces a reflection image of the specimen.

Thus, the transmission type scanning electron microscope is provided with the two electron detectors. The scanning electron microscope is further provided with a circuit for selecting signals out of the signals from the two electron detectors. The entire scanning electron microscope therefore becomes complicated and expensive.

It is therefore, an object of the present invention to overcome the above-described drawbacks, and to provide an electron multiplier which enables the scanning electron microscopes to produce both a reflection image and a transmission image of a specimen. Another object of the present invention is to provide an improved scanning electron microscope, provided with the electron multiplier, which can produce both a reflection image and a transmission image of a specimen and still which has a simple structure.

In order to attain the above and other objects, the present invention provides an electron multiplier for a scanning electron microscope which emits an electron beam to a specimen and which produces an image of the specimen, the electron multiplier comprising: electron reflection means for reflecting an electron beam which has passed by or which has passed through a specimen; and a microchannel plate formed with a plurality of channels, the microchannel plate being capable of receiving the electron beam reflected from the electron reflection means and being capable of multiplying the electron beam.

According to another aspect, the present invention provides a scanning electron microscope for forming an electron image of a specimen, the scanning electron microscope comprising: an electron source for emitting an electron beam toward a specimen, the electron beam being capable of reflecting off, passing by, and passing through the specimen; an electron multiplier capable of multiplying the electron beam which has passed by or which has passed through the specimen, the electron multiplier including: electron reflection means for reflecting the electron beam which has passed by or which has passed through the specimen; and a microchannel plate formed with a plurality of channels, the microchannel plate being capable of receiving the electron beam reflected from the electron reflection means and capable of multiplying the electron beam; and a single electron detector capable of detecting electrons which have reflected from the specimen and which have been multiplied by the microchannel plate after having passed through or passed by the specimen. The electron source preferably includes scanning means for scanning the electron beam so that the electron beam reflects off the specimen, passes by the specimen, or passes through the specimen according to a beam scanning position.

BRIEF DESCRIPTION OF THE DRAWINGS

The above and other objects, features and advantages of the invention will become more apparent from reading the following description of the preferred embodiment taken in connection with the accompanying drawings in which.

3

Figure 1:
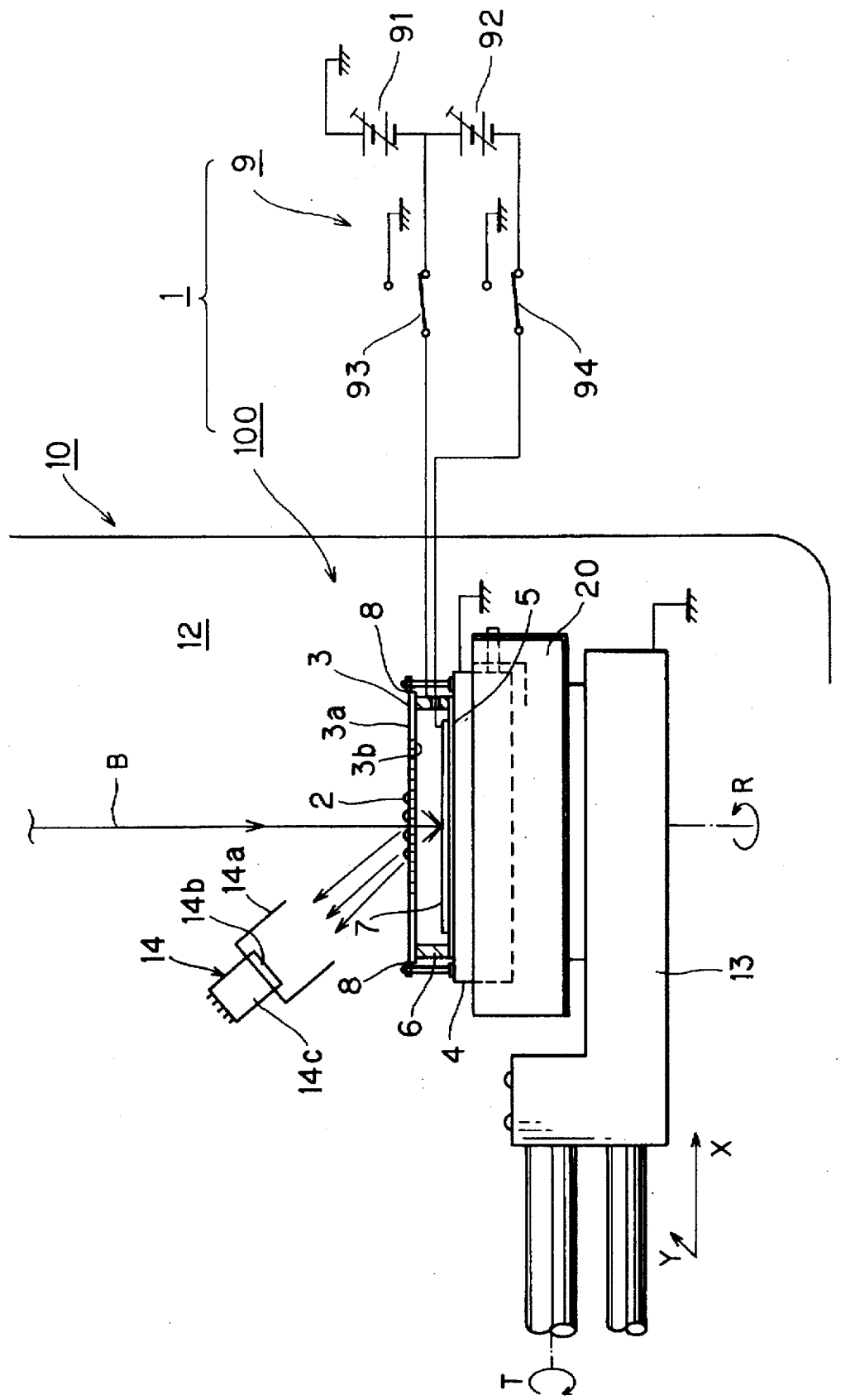
FIG. 1 shows an illustrative view of an electron multiplier according to a preferred embodiment of the present invention.
Figure 4:
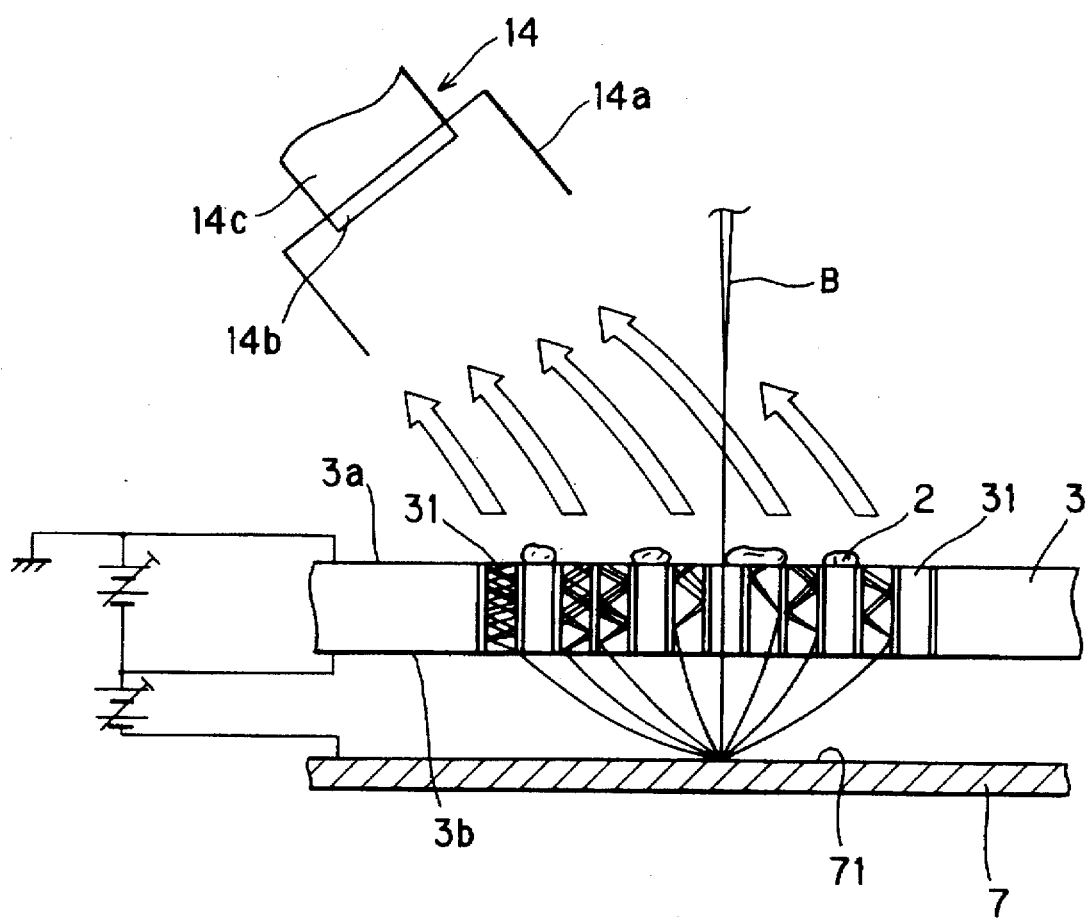
Figure 5:
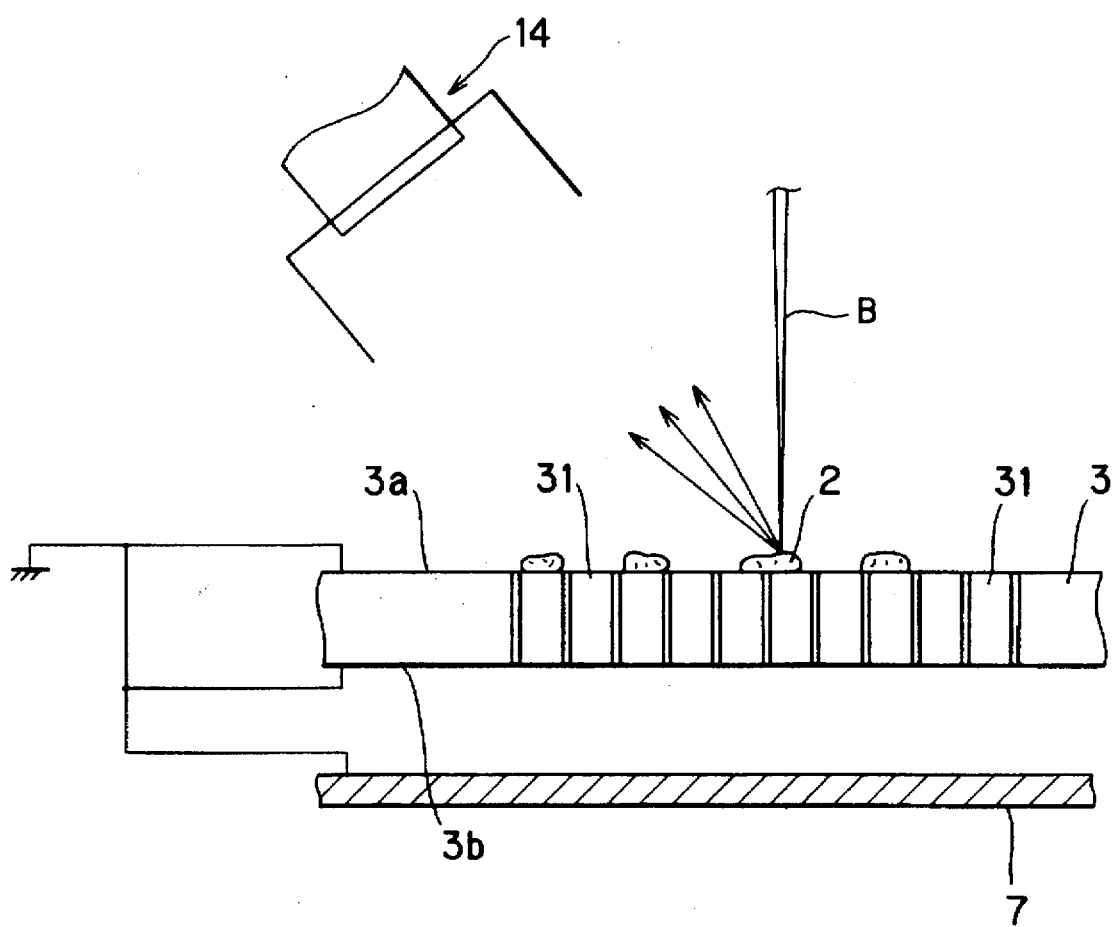

FIG. 4 illustrates a manner how electrons pass through or pass by a specimen and how the electrons are multiplied by the electron multiplier of FIG. 1;

FIG. 5 illustrates a manner how electrons reflect off the specimen; and

Figure 6:
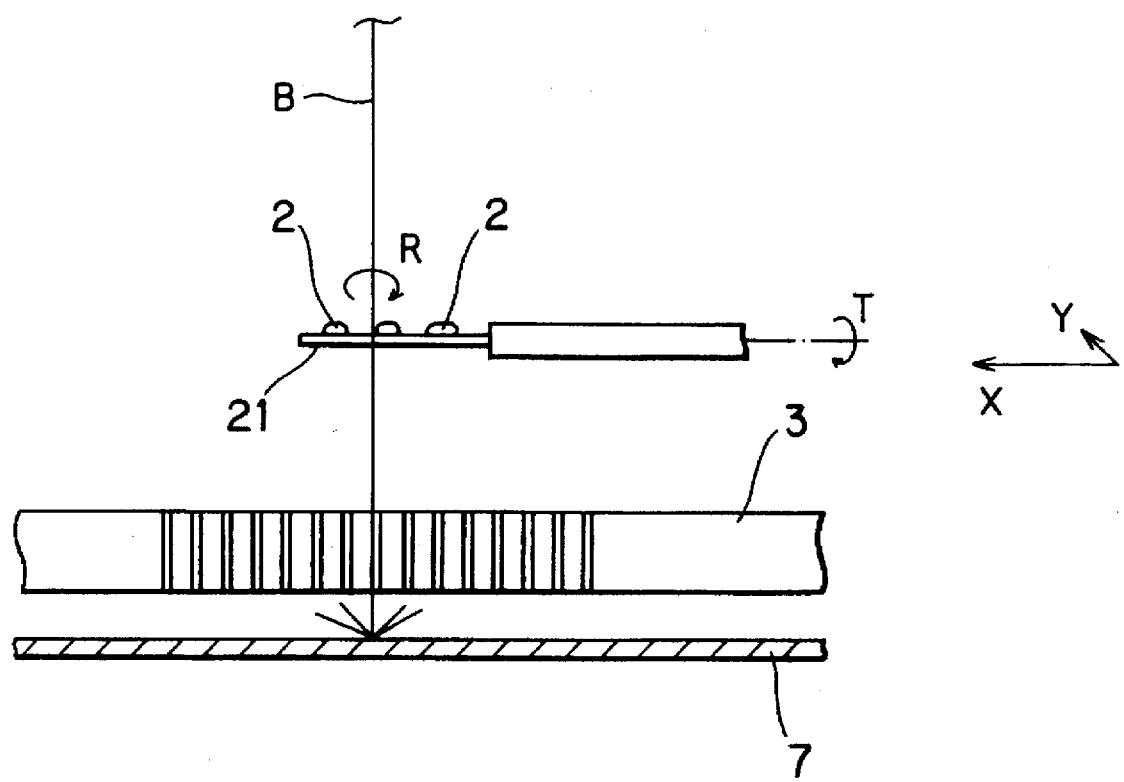

FIG. 6 shows a modification of a mount for mounting the specimen.

DETAILED DESCRIPTION OF THE PREFERRED EMBODIMENT

An electron multiplier according to a preferred embodiment of the present invention will be described while referring to the accompanying drawings wherein like parts and components are designated by the same reference numerals to avoid duplicating description.

FIG. 1 shows an entire structure of an electron multiplier 1 of the embodiment of the present invention. This electron multiplier 1 is detachably mounted in a scanning electron microscope 10 shown in FIG. 2.

Figure 2:
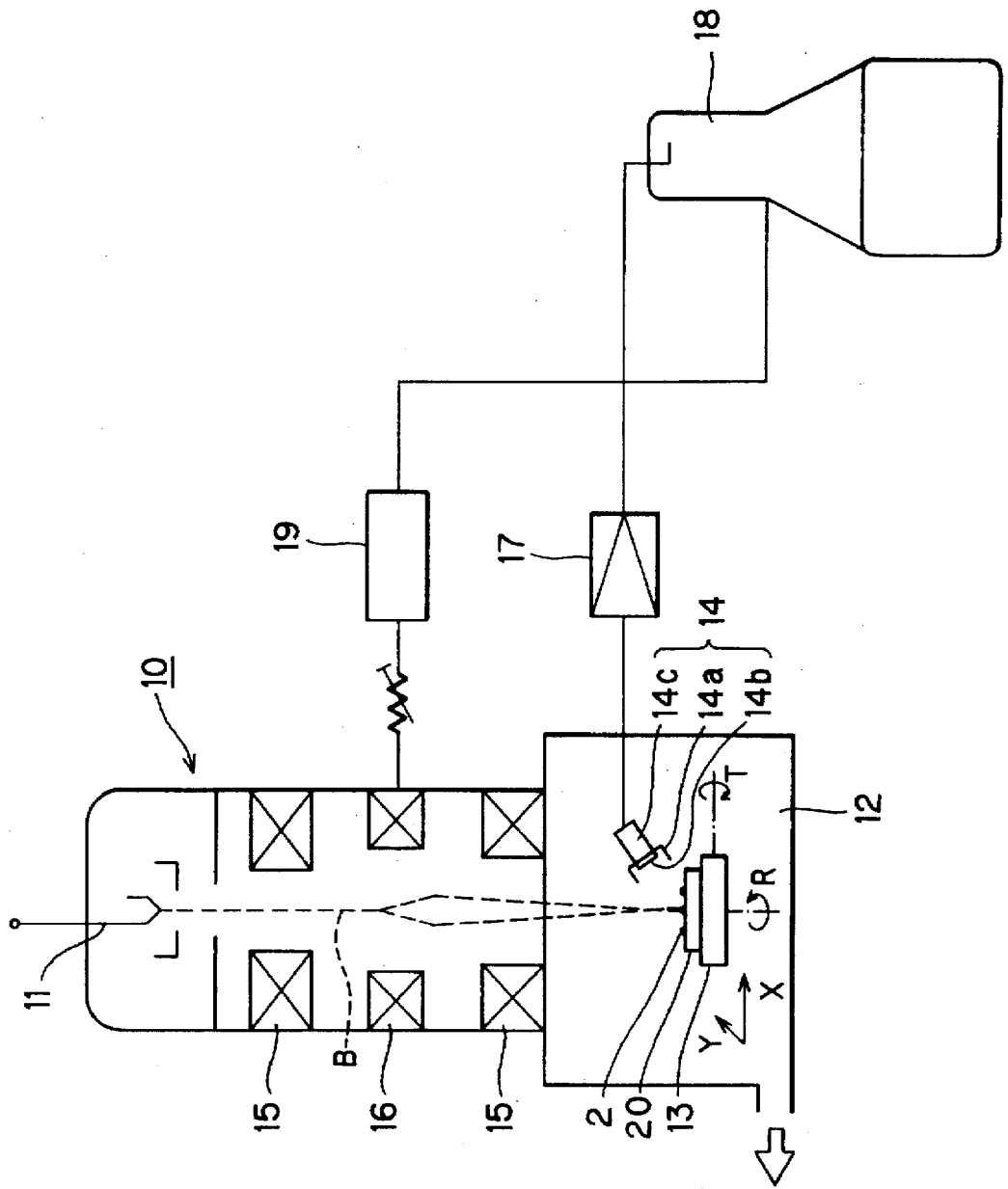
FIG. 2 shows an illustrative view of an electron microscope in which the electron multiplier of FIG. 1 is to be mounted.

FIG. 2 shows the scanning electron microscope 10 in which the electron multiplier 1 is not yet mounted. The scanning electron microscope 10 is of a reflection type which is capable of producing an image based on electrons reflected from a specimen 2. The scanning electron microscope 10 has an electron gun 11 and a vacuum chamber 12 at opposite ends. The inside of the vacuum chamber 12 can be brought into a vacuum state. A movable stand 13 is provided in the vacuum chamber 12. A dish-shaped vessel or holder 20 is mounted on the stand 13. An electron detector 14 is provided in the vacuum chamber 12 above the movable stand 13.

The vessel 20 on the movable stand 13 is for mounting the specimen 2. The movable stand 13 is movable along horizontal axes X and Y which are perpendicular with each other. The movable stand 13 is able to tilt about another horizontal axis T. The movable stand 13 is also rotatable about a vertical axis R which passes through the center of the movable stand 13.

The electron detector 14 is for receiving electrons and for converting the electrons into electric signals. In this example, the electron detector 14 is constructed from a collector 14a, a scintillator 14b, and a photomultiplier tube 14c. The collector 14a is for collecting electrons to be detected. The scintillator 14b is for receiving the thus collected electrons and for emitting fluorescence accordingly. The photomultiplier tube 14c is for receiving the fluorescence. When receiving the fluorescence light, the photomultiplier tube 14c generates photoelectrons, multiplies the electrons, and then outputs the multiplied electrons as an electric signal. The photomultiplier tube 14c is electrically connected via an amplifier 17 to a CRT 18.

A pair of electron lenses 15 are provided between the electron gun 11 and the vacuum chamber 12. A deflection coil 16 is provided between the pair of electron lenses 15. A scanning electric drive source 19 is electrically connected both to the deflection coil 16 and to a deflection coil (not shown) provided in the CRT 18.

With the above-described structure, the scanning electron microscope 10 can produce a reflection image of the specimen 2 as described below.

The electron gun 11 emits an electron beam B in a direction toward the vacuum chamber 12. The electron beam B is scanned by the deflection coil 16 in directions along the X and Y axes. The electron beam B is focused by the electron lenses 15 onto the specimen 2 set on the movable

4 stand 13. When the specimen 2 is bombarded with the electrons, the specimen 2 reflects the electron beam B as reflected primary electrons. The specimen 2 also emits secondary electrons. (The thus reflected primary electrons and the secondary electrons will be referred to collectively as specimen-reflected electrons hereinafter.) The specimen-reflected electrons are detected by the electron detector 14, which in turn outputs electric signals indicative of the detected specimen-reflected electrons. The electric signals are amplified by the amplifier 17 and then supplied to the CRT 18 as video signals. The scanning electric drive source 19 supplies scanning electric voltages both to the deflection coil 16 and to the deflection coil of the CRT 18 in synchronization with each other. The CRT 18 therefore displays a magnified reflection image of the specimen 2.

Next, the electron multiplier 1 of the present embodiment will be described. The electron multiplier 1 can be detachably mounted to the electron microscope 10. The electron multiplier 1 can allow the electron microscope 10 to produce not only a reflection image but also a transmission image of the specimen 2. In other words, the electron multiplier 1 allows the electron microscope 10 to operate both in a reflection mode and in a transmission mode.

As shown in FIG. 1, the electron multiplier 1 is comprised of a body portion 100 and an electric power supplying portion 9. As shown in FIG. 1, the body portion 100 is detachably mounted on the vessel 20 on the movable stand 13.

Figure 3:
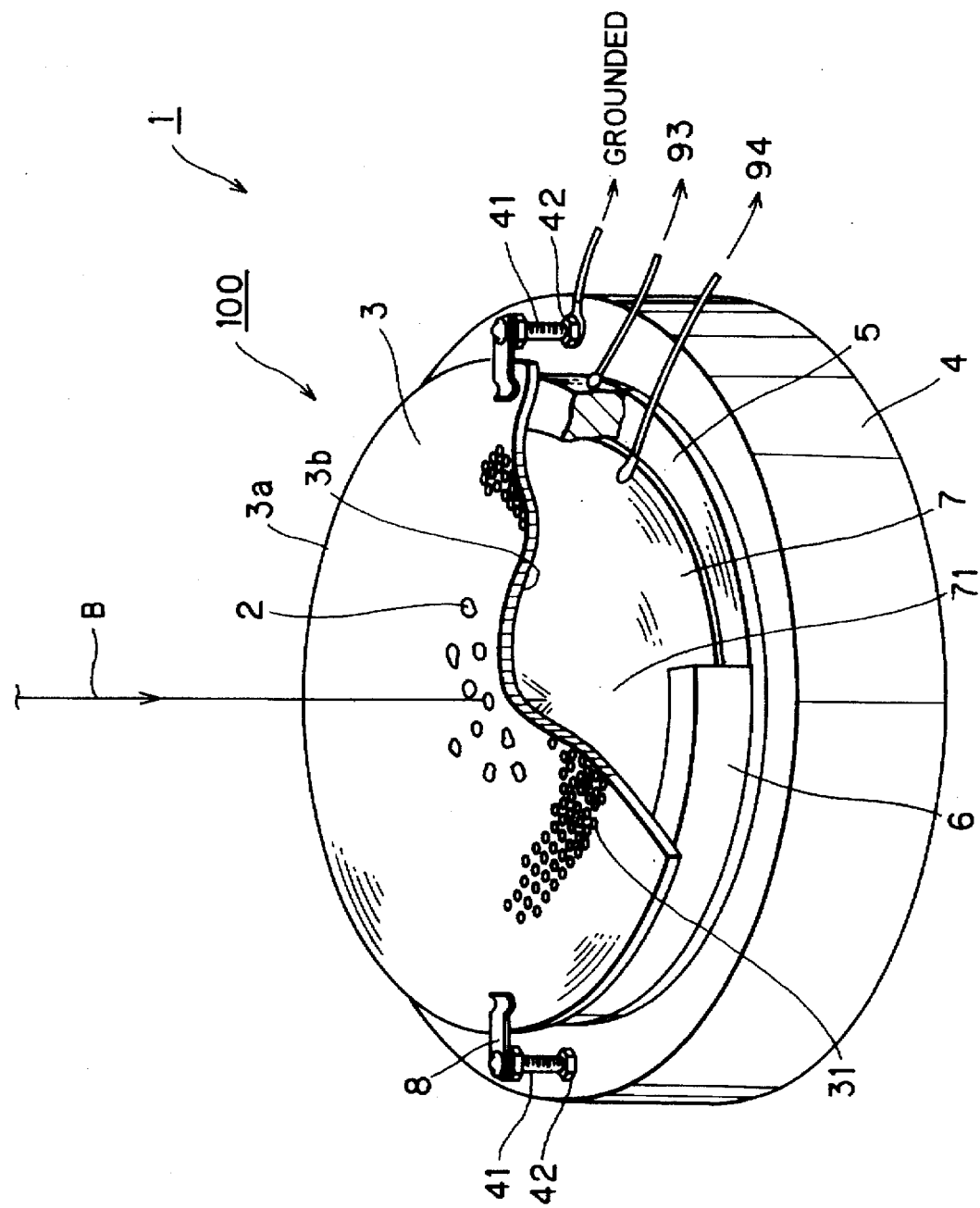
FIG. 3 is a perspective view of a body portion of the electron multiplier of FIG. 1.

As shown in FIG. 3, the body portion 100 includes a microchannel plate 3 in its uppermost position. The microchannel plate 3 is mounted on an upper surface of a ring 6. The ring 6 is made of conductive material such as copper. The ring 6 is mounted on an upper surface of a stand 4 via a plate-shaped insulator 5. The stand 4 is made of conductive material such as an aluminum. The stand 4 is electrically grounded. The insulator 5 is made of insulating material such as glass. A pair of bolts 41 are fixedly secured via nuts 42 to the upper surface of the stand 4. A pair of springs 8 are mounted to a head portion of the bolts 41. The microchannel plate 3 is held down by the pair of leaf springs 8 on the upper surface of the ring 6. With this arrangement, the microchannel plate 3 is not easily removed from the ring 6. By flexing the leaf springs 8, the microchannel plate 3 can be detached from the ring 6 and a new microchannel plate can be attached to the ring 6.

The microchannel plate 3 serves for multiplying electrons. The microchannel plate 3 has opposite surfaces: an upper surface 3a and a lower surface 3b. Each of the surfaces 3a and 3b is covered with an electrode. A number of channels 31 pass through the microchannel plate 3 from the upper surface 3a to the lower surface 3b. An inner sidewall of each channel 31 is formed with a secondary electron emission film. According to the present embodiment, a specimen 2 is mounted on the upper surface 3a of the microchannel plate 3. The upper surface 3a is electrically grounded because the upper surface 3a is electrically connected to the stand 4 via the leaf springs 8 and the bolts 41.

In the electron multiplier 1, an electron reflection plate 7 is provided in confrontation with the lower surface 3b of the microchannel plate 3. The electron reflection plate 7 is located parallel to the microchannel plate 3. The electron reflection plate 7 is separated from the microchannel plate 3 by a certain amount of distance.

In more concrete terms, the electron reflection plate 7 is fixedly secured to the upper surface of the insulator 5 and is surrounded by the ring 6. The electron reflection plate 7 is therefore separated from the microchannel plate 3 by a distance equal to the height of the ring 6. Because the electron reflection plate 7 is mounted on the insulator 5, the electron reflection plate 7 is electrically insulated from the electrically-grounded stand 4.

The electron reflection plate 7 has an electron reflecting surface 71 (upper surface) in confrontation with the lower surface 3b of the microchannel plate 3. When the electron beam B passes by or passes through the specimen 2, the electron beam B bears thereon information on a transmission image of the specimen 2. The electron beam that has passed by or that has passed through the specimen 2 will be referred to as non-specimen-reflected electrons hereinafter. The transmission image of the specimen indicates an internal structure of the specimen surrounded by an outline of the specimen. The non-specimen-reflected electrons further pass through one or more of the channels 31, and reach the electron reflecting surface 71. The electron reflecting surface 71 reflects the non-specimen-reflected electrons as reflected primary electrons. The electron reflecting surface 71 also generates secondary electrons.

The electron reflection plate 7 is made of Cu—Be alloy, for example, which can highly efficiently reflect the non-specimen-reflected electrons and which can highly efficiently generate secondary electrons when bombarded with the non-specimen-reflected electrons. The electron reflection plate 7 may be made from other various materials that can highly efficiently reflect the non-specimen-reflected electrons and that can highly efficiently generate secondary electrons when bombarded with the non-specimen-reflected electrons.

According to the present embodiment, during the transmission mode, the electron reflection plate 7 is applied with an electric voltage lower than that applied to the lower surface 3b of the microchannel plate 3. With this electrical condition, the non-specimen-reflected electrons and the secondary electrons will be electrically accelerated from the electron reflection plate 7 in a direction back to the microchannel plate 3.

It is noted that the electron reflecting surface 71 is corrugated. That is, the electron reflecting surface 71 is formed with tiny indentations and protrusions. Accordingly, the non-specimen-reflected electrons and the secondary electrons will scatter away from the electron reflecting surface 71 and will spread when travelling back to the microchannel plate 3. Accordingly, the electrons enter several channels 31 of the microchannel plate 3. It is possible to prevent the whole electrons from gathering to enter a single channel 31. It is therefore possible to prevent a certain channel from being electrically saturated.

During the transmission mode, the lower surface 3b of the microchannel plate 3 is applied with an electric potential lower than of the upper surface 3a. With this electrical condition, the microchannel plate 3 can multiply electrons that enter the channels 31 from the lower surface side. That is, if an electron enters a certain channel 31 from the lower surface 3b side, an inner sidewall of the channel 31 emits secondary electrons every time the electron collides with the inner sidewall. Accordingly, a multiplied number of electrons will be generated in the channel 31 and will output from the channel 31 at the upper surface 3a. The thus multiplied electrons will then travel toward the electron detector 14. The electrons will be detected by the electron detector 14 and will be displayed on the CRT 18 as the transmission image of the specimen 2.

As shown in FIG. 1, the electric power supplying portion 9 is electrically connected to both the microchannel plate 3 and the electron reflection plate 7. The electric power supplying portion 9 includes: a variable electric power supply 91 for supplying a variable electric voltage to the lower surface 3b of the microchannel plate 3; and a variable electric power supply 92 for supplying a variable electric voltage between the surface 3b and the electron reflection plate 7. The electric power supply 91 can apply a voltage in the range of 0 to −2 kV to the lower surface 3b. The electric power supply 92 can apply a voltage in the range of 0 to 100 V between the electron reflection plate 7 and the surface 3b.

A switch 93 is provided between the power supply 91 and the lower surface 3b of the microchannel plate 3. When the switch 93 is turned ON, the switch 93 electrically connects the lower surface 3b with the power supply 91. When the switch 93 is turned OFF, the switch electrically grounds the lower surface 3b. Another switch 94 is provided between the power supply 92 and the electron reflection plate 7. When the switch 94 is turned ON, the switch 94 electrically connects the electron reflection plate 7 with the electric power supply 92. When the switch 94 is turned OFF, the switch electrically grounds the electron reflection plate 7.

With the above-described electrical connection, the switches 93 and 94 are turned ON during the transmission mode. Because the electron reflection plate 7 and the microchannel plate 3 are energized, the scanning electron microscope 10 produces a transmission image of the specimen 2. That is, when the reflection plate 7 reflects the non-specimen-reflected electrons and generates the secondary electrons, those electrons will efficiently travel back to the microchannel plate 3. The electrons will enter the channels 31 from the side of the lower surface 3b and will be multiplied in the channels 31. Thus multiplied electrons (which will be referred to collectively as multiplied, non-specimen-reflected electrons hereinafter) will output from the microchannel plate 3. Bearing a transmission image of the specimen 2, the multiplied, non-specimen-reflected electrons will be detected by the detector 14. The CRT 18 will display the transmission image of the specimen 2.

During the reflection mode, on the other hand, the switches 93 and 94 are turned OFF. Because the electron reflection plate 7 and the microchannel plate 3 are both electrically grounded, the electron microscope 10 produces a reflection image of the specimen 2. That is, even when the electron beam B strikes the electron reflection plate 7, electrons will not efficiently return to the microchannel plate 3. In addition, the microchannel plate 3 will fail to multiply the electrons. Accordingly, the detector 14 will not receive non-specimen-reflected electrons, but only receive specimen-reflected electrons. The detector 14 will therefore detect a reflection image of the specimen 2.

With the above-described structure, the electron multiplier 1 operates as described below.

First, the specimen 2 is mounted on the microchannel plate 3 in intimate contact with the upper surface 3a. The microchannel plate 3 mounted with the specimen 2 is then mounted on the ring 6 of the electron multiplier 1. The microchannel plate 3 is fixedly held down on the ring 6 by the leaf springs 8. Then, the body portion 100 thus properly mounted with the specimen 2 is set in the inside of the electron microscope 10 as shown in FIG. 1. In more concrete terms, the body portion 100 is mounted in the vessel 20 on the movable stand 13 in the vacuum chamber 12. The tilting position of the movable stand 13 is adjusted so that the microchannel plate 3 will be disposed in a horizontal posture. Then, air is discharged out of the vacuum chamber 12 and is brought into a vacuum condition.

When desiring to observe a transmission image of the specimen 2, the scanning electron microscope 10 is brought into a transmission mode. That is, the switch 93 is turned ON so that the lower surface 3b is electrically applied with −700 volts. The switch 94 is also turned ON so that the electron reflection plate 7 is applied with an electric voltage which is lower than that applied to the lower surface 3b by an amount of 100 volts. Accordingly, the lower surface 3b is applied with an electric voltage of −800 volts. In the electron detector 14, the collector 14a is applied with +100 volts, and the scintillator 14b is applied with +10 kilovolts.

In the above-described electric condition, the electron gun 11 is controlled to emit the electron beam B toward the specimen 2 on the microchannel plate 3 as shown in FIG. 3. Because the microchannel plate 3 is in the horizontal posture, the electron beam B travels parallel with the inner sidewalls of the channels 31. It is noted that when the microchannel plate 3 is slanted with respect to the electron beam B, the tilting position of the movable stand 13 is adjusted so that the channels 31 extend parallel with the electron beam B. Then, the scanning electric drive source 19 is controlled so as to scan the electron beam B in a predetermined range on the upper surface 3a of the microchannel plate 3.

As shown in FIG. 4, when the electron beam B reaches a position on the microchannel plate 3 which is shifted from the specimen 2, the electron beam B passes by the specimen 2. Similarly, when the electron beam B reaches a through-hole formed in the specimen 2, the electron beam B passes through the through-hole. Those electrons will be referred to collectively as specimen-side-passing electrons hereinafter. The specimen-side-passing electrons therefore bear thereon information on a background of the specimen 2. The background defines an outline (inner and outer boundaries) of the specimen 2. Similarly, when the electron beam B reaches a thin portion of the specimen 2, at least a part of the electron beam B passes through the specimen 2. The specimen-penetrating electrons bear thereon information on the internal structure of the thin portion. The above-described specimen-side-passing electrons and the specimen-penetrating electrons will be referred to collectively as non-specimen-reflected electrons hereinafter. The non-specimen-reflected electrons therefore bear thereon information on a transmission image of the specimen 2. The transmission image indicates the internal structure of the specimen thin portion and an outline of the specimen 2.

The non-specimen-reflected electrons then pass through one or more channel 31 to reach the electron reflecting surface 71 of the electron reflection plate 7. The electron reflecting surface 71 reflects the non-specimen-reflected electrons. The electron reflecting surface 71 also generates secondary electrons. Because the electron reflecting surface 71 is formed with corrugations, the non-specimen-reflected electrons and the secondary electrons scatter away from the reflection plate 7. The electrons are then accelerated back to the microchannel plate 3, which has an electric potential higher than that of the electron reflecting surface 71 by the amount of 100 volts.

The non-specimen-reflected electrons and the secondary electrons then enter the channels 31 of the microchannel plate 3 from the lower surface side. The electrons are multiplied in the channels 31. Thus multiplied electrons (which will be referred to collectively as multiplied, non-specimen-reflected electrons hereinafter) output from the upper surface 3a. It is noted that the electrons partly strike the specimen 2, which is located on the upper surface 3a, and electrically neutralize the specimen 2 which has been positively charged by the original electron beam B. The specimen 2 can therefore be prevented from being electrically charged up.

The remaining parts of the multiplied, non-specimen-reflected electrons are guided toward the collector 14a, which is disposed above the specimen 2 and which is applied with a higher electric voltage than the upper surface 3a is. The electrons fall incident on the scintillator 14b where the electrons are converted into fluorescent light. The fluorescent light is then detected by the photomultiplier tube 14c as an electric signal. The electric signal indicates the transmission image of the specimen 2.

It is noted that when the original electron beam B reaches the thick part of the specimen 2, the electron beam B can not pass through the thick part.

It is further noted that when the original electron beam B reaches the surface of the specimen 2, the specimen surface reflects the electron beam B as reflected primary electrons. The specimen surface also generates secondary electrons. These electrons bear thereon a reflection image of the specimen 2 indicative of the surface structure of the specimen 2. These electrons will be referred to collectively as specimen-reflected electrons hereinafter. The specimen-reflected electrons will travel directly toward the electron detector 14. Because these specimen-reflected electrons fail to be multiplied by the microchannel plate 3, the amount of the specimen-reflected electrons is greatly smaller than the amount of the multiplied, non-specimen-reflected electrons which have been multiplied by the microchannel plate 3. In more concrete terms, the amount of the specimen-reflected electrons is about as small as $1/1,000$ to $1/10,000$ of the amount of the multiplied, non-specimen-reflected electrons. The electron detector 14 can therefore neglect the amount of the specimen-reflected electrons.

Electric signals produced at the electron detector 14 are amplified at the amplifier 17 and are inputted into the CRT 18 as video signals. The deflection coil in the CRT 18 is controlled in synchronization with the deflection coil 16 so that the CRT 18 will display the transmission image of the specimen 2 based on the video signals.

Thus produced transmission image has a dark portion corresponding to the specimen 2. The dark portion is surrounded by a bright background area corresponding to an area of the upper surface 3a where the specimen 2 is not located. The bright background area is obtained from the multiplied specimen-side-passing electrons, and the dark portion is obtained from the specimen-reflected electrons. Because the amount of the specimen-reflected electrons is about $1/1,000$ to $1/10,000$ of that of the multiplied specimen-side-passing electrons, the transmission image has a high contrast. The transmission image therefore shows a clear outline of the specimen 2.

The dark portion in the transmission image has a bright area indicative of the thin part of the specimen 2. The bright area is obtained from the multiplied specimen-penetrated electrons. The bright area therefore has an intensity distribution corresponding to the internal structure of the thin part.

The transmission image can maintain its high contrast even when the amount of the electron beam B is decreased. Accordingly, by decreasing the amount of the electron beam B, it is possible to make narrow the electron beam B and therefore allow the CRT 18 to display a transmission image at a higher resolution. The transmission image will still have a high contrast.

When desiring to observe a reflection image of the specimen 2, on the other hand, the electron microscope 10 is brought into a reflection mode. That is, the switches 93 and 94 are turned OFF. As a result, the microchannel plate 3 and the electron reflection plate 7 are electrically grounded. The microchannel plate 3 stops its multiplying function. The microchannel plate 3 and the electron reflection plate 7 stop their electron reflecting function.

Under this condition, in the same manner as during the transmission mode, the electron gun 11 is controlled to emit the electron beam B toward the specimen 2 on the microchannel plate 3. When the electron beam B reaches the specimen 2 as shown in FIG. 5, the specimen 2 reflects the electron beam B as reflected primary electrons. The specimen 2 also generates secondary electrons. Thus obtained specimen-reflected electrons are guided to and detected by the electron detector 14. The gain of the amplifier 17 is adjusted so that the CRT 18 can display a reflection image of the specimen 2. The reflection image indicates the surface structure of the specimen 2.

It is noted that when the electron beam B reaches an area of the upper surface 3a where the specimen 2 is not located, the electron beam B passes by the specimen 2. The electron beam B then passes through a channel 31 of the microchannel plate 3 and reaches the electron reflection plate 7. The electron reflecting surface 71 reflects the electron beam B as reflected primary electrons. The electron reflecting surface 71 also generates secondary electrons. Those electrons scatter away from the corrugated surface 71. During this reflection mode, however, both the electron reflection plate 7 and the microchannel plate 3 are electrically grounded. Accordingly, the electrons will not be accelerated back to the microchannel plate 3. Even when the electrons partly return to the microchannel plate 3, the electrons are not multiplied in the microchannel plate 3. Accordingly, those electrons will not be detected by the electron detector 14.

As described above, in the scanning electron microscope 10, the electron beam B is emitted to the specimen 2. When the electron beam B strikes the specimen 2, the specimen 2 reflects the electron beam as reflected primary electrons and generates secondary electrons. Those electrons are detected by the electron detector 14, which in turn produces a reflection image of the specimen 2. The electron multiplier 1 of the present invention is used for this scanning electron microscope 10. The electron multiplier 1 includes the electron reflection plate 7 which receives the electron beam B when the electron beam B does not reflect off the specimen 2 but passes by or passes through the specimen 2. Upon receipt of the non-specimen-reflected electron beam B, the electron reflection plate 7 reflects the electron beam B as reflected primary electrons and generates secondary electrons. The microchannel plate 3 is formed with a multiplicity of channels 31 for multiplying the reflected primary electrons and the secondary electrons before emitting the electrons toward the electron detector 14.

While the invention has been described in detail with reference to the specific embodiment thereof, it would be apparent to those skilled in the art that various changes and modifications may be made therein without departing from the spirit of the invention.

In the above-described embodiment, the electron multiplier 1 is detachably mounted in the reflective type scanning electron microscope 10. However, the electron multiplier 1 may be fixedly mounted in the scanning electron microscope 10. That is, the electron multiplier 1 may be mounted in the scanning electron microscope 10 when the scanning electron microscope 10 is produced. This integrated-type scanning electron microscope 10 will be sold as a scanning electron microscope which can produce both a reflection image and a transmission image of the specimen 2.

As shown in FIG. 6, the electron multiplier 1 may further include a mount 21. The mount 21 is provided separately from the microchannel plate 3. The mount 21 may be provided above the microchannel plate 3. The specimen 2 can be mounted on the mount 21. The mount 21 is made from a material, such as a mesh material, which can transmit therethrough the electron beam B. The mount 21 is preferably movable. That is, the mount 21 is movable parallel with the horizontal axes X and Y. The mount 21 is rotatable about another horizontal axis T. The mount 21 is rotatable also about its vertical central axis R.

In the above-described embodiment, the specimen 2 is mounted on the microchannel plate 3 in intimate contact with the upper surface 3a. However, the specimen 2 may be buried in the microchannel plate 3. Or, the specimen 2 may be intimately contacted with the lower surface 3b of the microchannel plate 3. The manner of mounting the specimen 2 to the microchannel plate 3 depends on the material of the specimen 2 and a required observation manner.

In order to precisely locate the electron multiplier 1 so that the electron beam B will travel parallel to the channels 31, the electron microscope 10 may be driven in the transmission mode. The CRT 18 is controlled to display circular-shaped ends of a certain channel 31 which are exposed on both sides 3a and 3b of the microchannel plate 3. The movable stand 13 is tilted so that the circular ends are brought into a concentric relation with each other.

As described above, the electron multiplier of the present invention is mounted in a scanning electron microscope, which is designed to emit an electron beam onto a specimen and to produce an image of the specimen. In the electron multiplier, the electron reflection plate is provided for reflecting the electron beam which has passed by or which has passed through the specimen and therefore which bears thereon information on a transmission image of the specimen. The microchannel plate is provided for receiving the electron beam which has reflected off the electron reflection plate. The microchannel plate multiplies the electron beam.

With the above-described structure, the electron multiplier allows the reflection type electron microscope to produce not only a reflection image but also a transmission image of the specimen. In this type of electron microscope, an electron beam is emitted onto the specimen. When the electron beam strikes the specimen, the specimen reflects the electron beam as reflected primary electrons and generates secondary electrons at its surface. An electron detector provided to the electron microscope detects those electrons and produces a reflection image of the specimen.

When the electron multiplier is mounted inside this reflection type electron microscope, the electron reflection plate receives the electron beam when the electron beam passes by or passes through the specimen. The electron beam (non-specimen-reflected electrons) bears thereon information on a transmission image of the specimen. The electron reflection plate then reflects the electron beams reflected primary electrons. The electron reflection plate also generates secondary electrons. The microchannel plate multiplies the reflected primary electrons and the secondary electrons. The multiplied electrons are then detected by the electron detector. The electron detector produces a transmission image of the specimen.

When the electron reflection plate is provided substantially in parallel with the microchannel plate, the non-specimen-reflected electron beam can pass through the microchannel plate before reaching the electron reflection plate. The microchannel plate can therefore be used also as a mount for mounting the specimen.

The electron multiplier is provided with the electric power supply for supplying electric voltages both to the electron reflection plate and to the microchannel plate. When the electron reflection plate and the microchannel plate are energized, the electron detector provides a transmission image of the specimen. When the electric power supply stops supplying the electric voltages to the electron reflection plate and the microchannel plate, the electron detector provides a reflection image. Accordingly, even though the scanning electron microscope has the single electron detector, the scanning electron microscope can provide both the reflection image and the transmission image.

Because the electron reflection plate is formed with corrugations, the reflected primary electrons and the secondary electrons scatter away from the electron reflection plate. With this structure, the reflected primary electrons and the secondary electrons widely spread while being guided to the microchannel plate. The channels of the microchannel plate are therefore prevented from being saturated with electric current. The scanning electron microscope can therefore always provide a high contrast electron image.

As described above, according to the present invention, the reflection type electron microscope is allowed to produce both a reflection image and a transmission image of a specimen. Because the electron reflection plate is provided substantially in parallel with the microchannel plate, the microchannel plate is used also as a mount for mounting a specimen thereon. Because the electric power supply selectively supplies electric voltages to the electron reflection plate and the microchannel plate, the electron microscope can alternately produce the reflection image and the transmission image. Because the electron reflection plate is formed with corrugations, the electron beam widely scatters away from the electron reflection plate and is guided back to the microchannel plate. Accordingly, the microchannel plate is free from electric current saturation. The microchannel plate can reliably provide a transmission image of the specimen.

What is claimed is:

1. An electron multiplier for a scanning electron microscope which emits an electron beam to a specimen and which produces an image of the specimen, the electron multiplier comprising:
    electron reflection means for reflecting an electron beam which has passed by or which has passed through a specimen; and
    a microchannel plate formed with a plurality of channels, the microchannel plate being capable of receiving the electron beam reflected from the electron reflection means and being capable of multiplying the electron beam.

2. An electron multiplier as claimed in claim 1, wherein the electron reflection means includes an electron reflection plate located substantially parallel with the microchannel plate.

3. An electron multiplier as claimed in claim 2, wherein the specimen is located on the microchannel plate.

4. An electron multiplier as claimed in claim 1, further comprising a specimen mounting plate for mounting the specimen, the specimen mounting plate being separated from the microchannel plate, the specimen mounting plate being capable of guiding, toward the electron reflection means, the electron beam which has passed by or passed through the specimen.

5. An electron multiplier as claimed in claim 1, further comprising electric power supply means capable of selectively supplying the microchannel plate with an electric voltage higher than the electron reflection means so as to guide the reflected electron beam toward the microchannel plate.

6. An electron multiplier as claimed in claim 1, further comprising microchannel plate energization means capable of selectively energizing the microchannel plate, the energized microchannel plate multiplying the received electron beam, the non-energized microchannel plate failing to multiply the received electron beam.

7. An electron multiplier as claimed in claim 1, further comprising electric power supply switching means for switching between an energization mode of supplying electric voltages to the microchannel plate and the electron reflection means and a non-energization mode of supplying no electric voltages to the microchannel plate and the electron reflection means.

8. An electron multiplier as claimed in claim 1, wherein the electron reflection means is formed with corrugations for allowing the electron beam to scatter away from the electron reflection means.

9. A scanning electron microscope for forming an electron image of a specimen, the scanning electron microscope comprising:
    an electron source for emitting an electron beam toward a specimen, the electron beam being capable of reflecting off, passing by, and passing through the specimen;
    an electron multiplier capable of multiplying the electron beam which has passed by or which has passed through the specimen, the electron multiplier including:
        electron reflection means for reflecting the electron beam which has passed by or which has passed through the specimen; and
        a microchannel plate formed with a plurality of channels, the microchannel plate being capable of receiving the electron beam reflected from the electron reflection means and capable of multiplying the electron beam; and
    a single electron detector capable of detecting electrons which have reflected from the specimen and which have been multiplied by the microchannel plate after having passed through or passed by the specimen.

10. A scanning electron microscope as claimed in claim 9, wherein the electron source includes scanning means for scanning the electron beam so that the electron beam reflects off the specimen, passes by the specimen, or passes through the specimen according to a beam scanning position.

11. A scanning electron microscope as claimed in claim 9, further comprising position adjusting means for adjusting a tilting position of the electron multiplier so that the plurality of channels of the microchannel plate extend substantially parallel to the electron beam emitted from the electron source, the electron beam which has passed by or passed through the specimen passing through at least one of the channels to reflect off the electron reflection means, the reflected electron beam being received and multiplied by the microchannel plate.

12. A scanning electron microscope as claimed in claim 11, wherein the electron reflection means includes an electron reflection plate located substantially parallel with the microchannel plate.

13. A scanning electron microscope as claimed in claim 12, wherein the specimen is located on the microchannel plate.

14. A scanning electron microscope as claimed in claim 11, wherein the electron multiplier further includes a specimen mounting plate for mounting the specimen, the specimen mounting plate being separated from the microchannel plate, the specimen mounting plate being capable of guiding, toward the electron reflection means, the electron beam which has passed by or passed through the specimen.

15. A scanning electron microscope as claimed in claim 9, wherein the electron multiplier further includes electric power supply means capable of selectively supplying the microchannel plate with an electric voltage higher than the electron reflection means so as to guide the reflected electron beam toward the microchannel plate.

16. A scanning electron multiplier as claimed in claim 9, wherein the electron multiplier further includes microchannel plate energization means capable of selectively energizing the microchannel plate, the energized microchannel plate multiplying the received electron beam, the non-energized microchannel plate failing to multiply the received electron beam.

17. A scanning electron microscope as claimed in claim 9, wherein the electron multiplier further includes electric power supply switching means for switching between an energization mode of supplying electric voltages to the microchannel plate and the electron reflection means and a non-energization mode of supplying no electric voltages to the microchannel plate and the electron reflection means.

18. A scanning electron microscope as claimed in claim 9, wherein the electron reflection means is formed with corrugations for allowing the electron beam to scatter away from the electron reflection means.

19. A scanning electron microscope as claimed in claim 9, wherein the electron multiplier is detachably mounted in the electron microscope.

* * * * *